United States Patent
Usuki

(10) Patent No.: US 9,419,410 B2
(45) Date of Patent: Aug. 16, 2016

(54) OPTICAL SEMICONDUCTOR DEVICE AND METHOD FOR CONTROLLING DRIVING CIRCUIT

(71) Applicant: FUJITSU LIMITED, Kawasaki-shi, Kanagawa (JP)

(72) Inventor: Tatsuya Usuki, Tsukuba (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/666,702

(22) Filed: Mar. 24, 2015

(65) Prior Publication Data

US 2015/0280394 A1 Oct. 1, 2015

(30) Foreign Application Priority Data

Mar. 28, 2014 (JP) ................. 2014-069495

(51) Int. Cl.
*H01S 5/042* (2006.01)
*G02F 1/01* (2006.01)
*H03K 17/78* (2006.01)

(52) U.S. Cl.
CPC .............. *H01S 5/0427* (2013.01); *H01S 5/042* (2013.01); *G02F 1/0121* (2013.01); *H03K 17/78* (2013.01)

(58) Field of Classification Search
CPC ... H01S 5/0261; H01S 5/02248; H01S 5/042; H03K 17/78; G02F 1/0121
IPC ............................. H01S 5/0261, 5/02248, 5/042
See application file for complete search history.

(56) References Cited

U.S. PATENT DOCUMENTS

2005/0243879 A1* 11/2005 Horiuchi ................. H01S 5/042
372/38.07
2008/0291952 A1* 11/2008 Yamamoto ............. B82Y 20/00
372/26

OTHER PUBLICATIONS

Tatsuya Usuki, "Robust Optical Data Transfer on Silicon Photonic Chip", Journal of Lightwave Technology, vol. 30, No. 18, Sep. 15, 2012, pp. 2933-2940 (4 pages).
Alexandra Kern et al., "18Gb/s Optical IO: VCSEL Driver and TIA in 90nm CMOS", 2007 Symposium on VLSI Circuits Digest of Technical Papers, pp. 276-277 (1 page).

* cited by examiner

*Primary Examiner* — Xinning Niu
(74) *Attorney, Agent, or Firm* — Fujitsu Patent Center

(57) ABSTRACT

An optical semiconductor device includes: an electric-optic conversion element that is provided with a diode; and a driving circuit that drives the diode in a forward direction, the driving circuit including a first switching circuit that is provided with a first switch, and a second switching circuit that is provided with a second switch, wherein the first switching circuit constitutes a first signal line that charges the electric-optic conversion element with an electric charge by bringing the first switch into an ON state and the second switch into an OFF state, and the second switching circuit constitutes a second signal line that discharges the electric charge stored in the electric-optic conversion element by bringing the second switch into an ON state and the first switch into an OFF state.

4 Claims, 13 Drawing Sheets

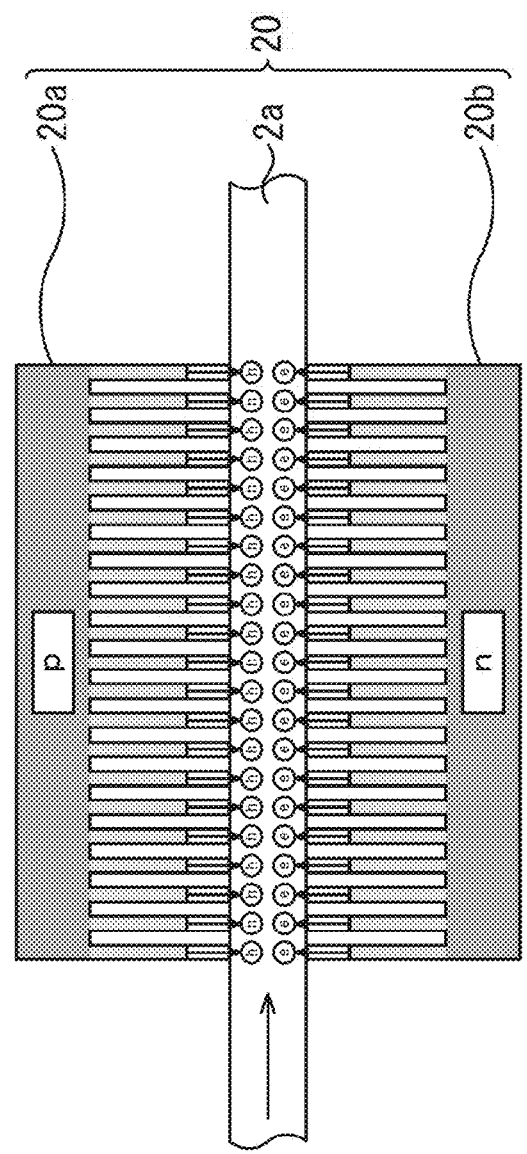

$\tau_1 < T_{bit}$ $\tau = (\eta/(\eta+1))C_{ON}/((G^{-1}_{load}+R)^{-1}+(\eta/(\eta+1))C_{ON})$ $V_{DD} = V_{TH} + (G^{-1}_{load}+R)(Q_1/\tau)$

OPTICAL SEMICONDUCTOR DEVICE AND METHOD FOR CONTROLLING DRIVING CIRCUIT

CROSS-REFERENCE TO RELATED APPLICATION

This application is based upon and claims the benefit of priority of the prior Japanese Patent Application No. 2014-069495, filed on Mar. 28, 2014, the entire contents of which are incorporated herein by reference.

FIELD

The embodiments relate to an optical semiconductor device and a method for controlling a driving circuit.

BACKGROUND

In a phase modulator provided in an optical waveguide, or a semiconductor laser such as a direct modulation laser, it is necessary to inject an electric charge in order to change a refractive index of the optical waveguide, or cause laser oscillation. Electrically, the phase modulator and the semiconductor laser are an electric-optic conversion element including a diode with a p-n junction illustrated in FIG. 7A.

In the phase modulator, there are two methods of applying a bias voltage to the diode, i.e., applying a bias voltage in a forward direction and in a reverse direction. In consideration of an optical loss, it is preferable to employ the driving method of applying a bias voltage in the forward direction by using a pin diode structure in which it is not necessary to add impurities into the optical waveguide. In the semiconductor laser, the diode is driven by applying a bias voltage in the forward direction in order to inject an electric charge.

FIG. 7B illustrates characteristics of the electric-optic conversion element including the diode by using an equivalent circuit (see T. Usuki, "*Robust Optical Data Transfer on Silicon Photonic Chip*", *JOURNAL OF LIGHTWAVE TECHNOLOGY*, VOL. 30, No. 18, P. 2933, Sep. 15, 2012.). In the equivalent circuit, capacitance C and conductance (conductivity of leakage resistance) G of the diode have nonlinearity with respect to a voltage. In the case of the semiconductor laser, the equivalent circuit exhibits characteristics including an optical resonator. The capacitance C includes capacitance obtained by photons accumulated in the optical resonator, and the conductance G includes conductance obtained through a process of removing light to outside of the optical resonator. In the diode, the capacitance C and the conductance G rapidly increase at a threshold voltage $V_{TH}$ or more particularly at the time of driving in the forward direction.

Here, for the purpose of simplifying discussion, the capacitance C and the conductance G of the diode are assumed to have constant values $C_{ON}$ and $G_{ON}$ at the threshold voltage $V_{TH}$ or more as illustrated in FIG. 7C. In this case, an electric charge $Q_C$ injected at the threshold voltage $V_{TH}$ or more and a leakage current monotonously increase. As illustrated in FIG. 7D, $Q_1$, $I_1$, and $V_1$ respectively represent an electric charge, a leakage current, and an applied voltage exhibiting a '1' state. In a '0' state, the values respectively become 0. In the equivalent circuit, parasitic resistance R also exists in series with the capacitance C.

When the diode has large capacitance in a case in which the diode is driven at high speed by applying a bias voltage in the forward direction, a modulation signal has noticeable frequency dependence. Thus, a matching circuit is inserted (see T. Usuki, "*Robust Optical Data Transfer on Silicon Photonic Chip*", *JOURNAL OF LIGHT TECHNOLOGY*< VOL. 30, No. 81, P. 2933, Sep. 15, 2012.).

FIG. 8 illustrates a circuit configuration obtained by combining a matching circuit 102 and a diode 103 with a CMOS inverter circuit 101. In the circuit configuration, capacitance of the matching circuit 102 is represented by $\eta C_{ON}$ by using efficiency $\eta$, and conductance of resistance of the matching circuit 102 is represented by $\eta G_{ON}$. When viewed from the side of the CMOS inverter circuit 101, total capacitance is $\eta C_{ON}/(1+\eta)$. When the efficiency $\eta$ is made sufficiently smaller than 1, the capacitance is decreased. Thus, the frequency dependence is decreased even at the time of high-speed operation.

FIG. 9A illustrates an equivalent circuit corresponding to the circuit configuration in FIG. 8. Here, an FET constituting the CMOS inverter circuit 101 is simply represented by combining internal resistance $G_{load}$ and a switch SW. In the equivalent circuit, it is necessary to apply appropriate internal resistance $G_{load}$ or an appropriate power supply voltage $V_{DD}$ in order that an optical semiconductor device outputs a '1' state when the CMOS inverter circuit 101 outputs a voltage on 'high' side (see a load line in FIG. 9B).

FIGS. 10A, 10B, and 10C illustrate timing charts in the circuit configuration in FIG. 8 (FIG. 9A). FIG. 10A illustrates a binary signal sequence having a bit time $T_{bit}$. FIG. 10B illustrates a state of the switch SW corresponding to the signal. An electric charge injected into the diode is modulated in accordance with an output of the CMOS inverter circuit. As illustrated in FIG. 10C, a time change of the electric charge has a time constant $\tau$. Normally, a leakage current is small, and $G_{ON} \ll G_{load}$, $R^{-1}$. Thus, it is found that when the efficiency $\eta$ is decreased, the time constant $\tau$ is also decreased, and the high-speed operation is enabled.

In the circuit configuration in FIG. 8 (FIG. 9A), the high-speed operation is enabled by decreasing the time constant $\tau$. However, while the electric charge is being increased from 0 to $Q_1$, a voltage applied to the matching circuit 102 is raised, and a current flowing from the CMOS inverter circuit 101 to the diode 103 is reduced. Therefore, as illustrated in FIG. 10C, a change amount when the electric charge rises from 0 is reduced as the electric charge approaches $Q_1$, and the electric charge is saturated. The saturation characteristics degrade an eye opening of a signal waveform.

To improve the eye opening, it is suitable to employ a pre-emphasis circuit obtained by combining two CMOS inverter circuits 111 and 112 and a delay circuit 113 (a delay time $T_D$) without using a passive matching circuit as illustrated in FIG. 11 (see A. Kern, A. Chandrakasan, and I. Young, "18Gb/s Optical IO: VCSEL Driver and TIA in 90 nm CMOS", P. 276, 2007 Symposium on VLSI Circuits Digest of Technical Papers.). FIG. 12A illustrates an equivalent circuit of the pre-emphasis circuit in FIG. 11. Here, the CMOS inverter circuits 111 and 112 are respectively modeled by switches $SW_A$ and $SW_B$ having internal conductance $G_A$ and internal conductance $G_B$, respectively. Since the number of transistors in the CMOS inverter circuit 111 is larger than that in the CMOS inverter circuit 112 as illustrated in FIG. 11, $G_A > G_B$. The internal conductance $G_A$ and the internal conductance $G_B$ are designed such that a voltage $V_1$ is applied to capacitance C by resistance-dividing a power supply voltage $V_{DD}$ when the switch $SW_A$ ($SW_B$) is in an ON (OFF) state as illustrated in FIG. 12B. Moreover, an applied voltage $V_C$ of the capacitance C needs to be a threshold voltage $V_{TH}$ or less when the switch $SW_A$ ($SW_B$) is in an OFF (ON) state.

FIGS. 13A, 13B, 13C, and 13D illustrate timing charts in the pre-emphasis circuit in FIG. 11 (FIG. 12A). FIG. 13A illustrates a binary signal sequence having a bit time $T_{bit}$.

FIGS. 13B and 13C illustrate states of the switches $SW_A$ and $SW_B$ corresponding to the signal. Here, the state of the switch $SW_B$ is delayed by the delay time $T_D$ with respect to the state of the switch $SW_A$. Here, $T_D<T_{bit}$. For example, it is designed such that $T_D=T_{bit}/2$.

As illustrated in FIG. 13D, an electric charge $Q_C$ is injected into the capacitance C only during the delay time $T_D$. Since the time constant τ itself is large, a change amount of the electric charge $Q_C$ is hardly saturated during the delay time $T_D$ as compared to the case of FIG. 10C. Therefore, rising of a signal waveform is defined almost by the delay time $T_D$, so that the eye opening is improved as compared to the case of FIG. 10C.

However, the pre-emphasis circuit in FIG. 11 (FIG. 12A) has the following problems.

First, the internal conductance of the CMOS inverter circuits 111 and 112 needs high accuracy in order to apply the voltage $V_1$ to the capacitance C by resistance-dividing the power supply voltage $V_{DD}$. Accuracy necessary for the voltage $V_1$ is generally 100 mV or less. When the power supply voltage $V_{DD}$ is, for example, 2V, an error allowed in the internal conductance $G_A$ and the internal conductance $G_B$ is less than 5%. The value is too strict as accuracy demanded in the FET.

Furthermore, when an optical semiconductor device maintains a '1' or '0' state, a through current flows through the CMOS inverter circuits 111 and 112. Therefore, power consumption is disadvantageously increased.

SUMMARY

One aspect of an optical semiconductor device includes: an electric-optic conversion element that is provided with a diode; and a driving circuit that drives the diode in a forward direction, the driving circuit including a first switching circuit that is provided with a first switch, and a second switching circuit that is provided with a second switch, wherein the first switching circuit constitutes a first signal line that charges the electric-optic conversion element with an electric charge independently of the second switching circuit by bringing the first switch into an ON state and the second switch into an OFF state, and the second switching circuit constitutes a second signal line that discharges the electric charge stored in the electric-optic conversion element independently of the first switching circuit by bringing the second switch into an ON state and the first switch into an OFF state.

One aspect of a method for controlling a driving circuit is a method for controlling a driving circuit that drives a diode of an electric-optic conversion element in a forward direction, the driving circuit including a first switching circuit that is provided with a first switch, and a second switching circuit that is provided with a second switch, the method including: charging the electric-optic conversion element with an electric charge independently of the second switching circuit by bringing the first switch into an ON state and the second switch into an OFF state; and discharging the electric charge stored in the electric-optic conversion element independently of the first switching circuit by bringing the second switch into an ON state and the first switch into an OFF state.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is an enlarged schematic plan view illustrating a side surface grating waveguide provided in an arm;

DESCRIPTION OF EMBODIMENTS

In the following, specific embodiments of an optical semiconductor device and a method for controlling a driving circuit are described in detail by reference to the drawings.

First Embodiment

Figure 1A:
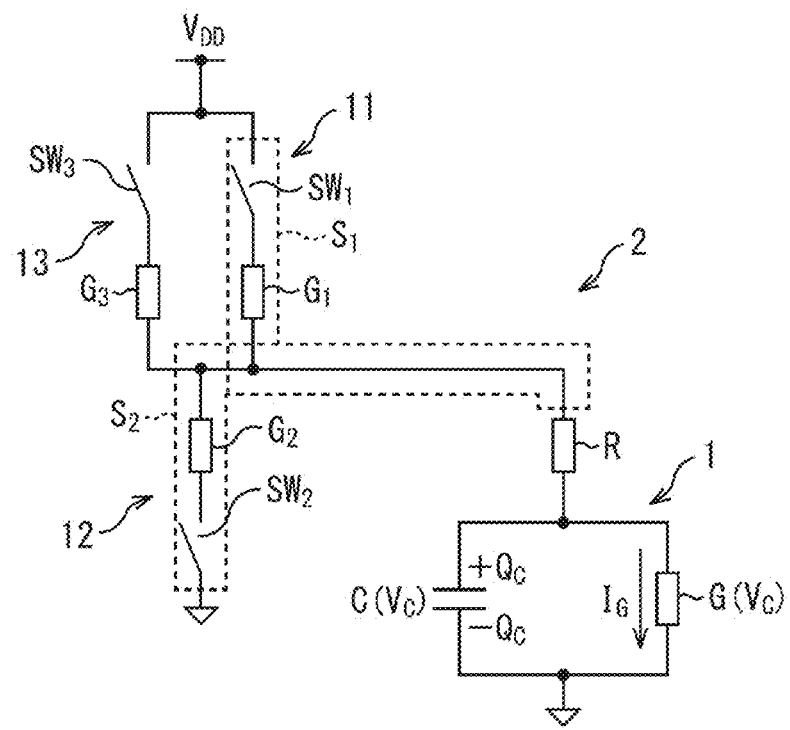
FIGS. 1A and 1B are views illustrating characteristics of a main configuration of an optical semiconductor device according to a first embodiment.

In a present embodiment, a main configuration (an electric-optic conversion element that is provided with a diode, and a driving circuit) and a function of an optical semiconductor device are disclosed. FIG. 1A is an equivalent circuit diagram illustrating characteristics of the main configuration of the optical semiconductor device.

Figure 7A:
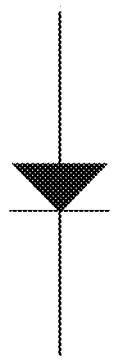
FIGS. 7A, 7B, 7C, and 7D are views illustrating characteristics of an electric-optic conversion element including a diode.
Figure 7B:
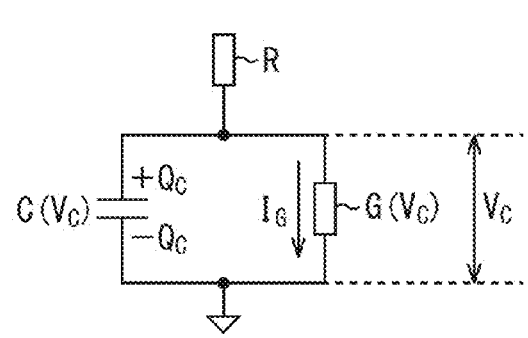
Figure 7C:
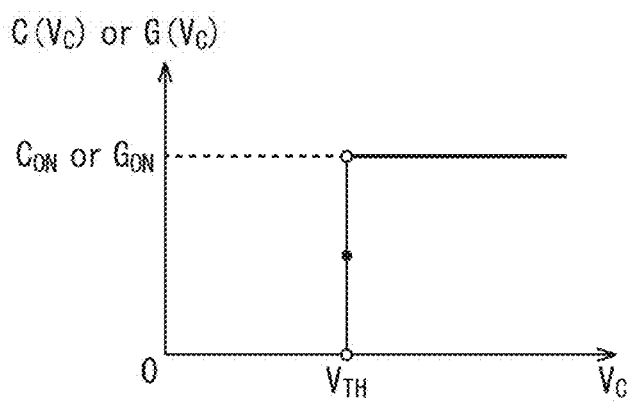
Figure 7D:
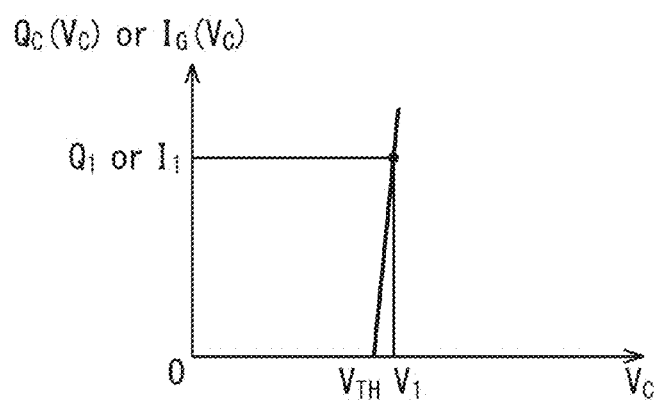
Figure 8:
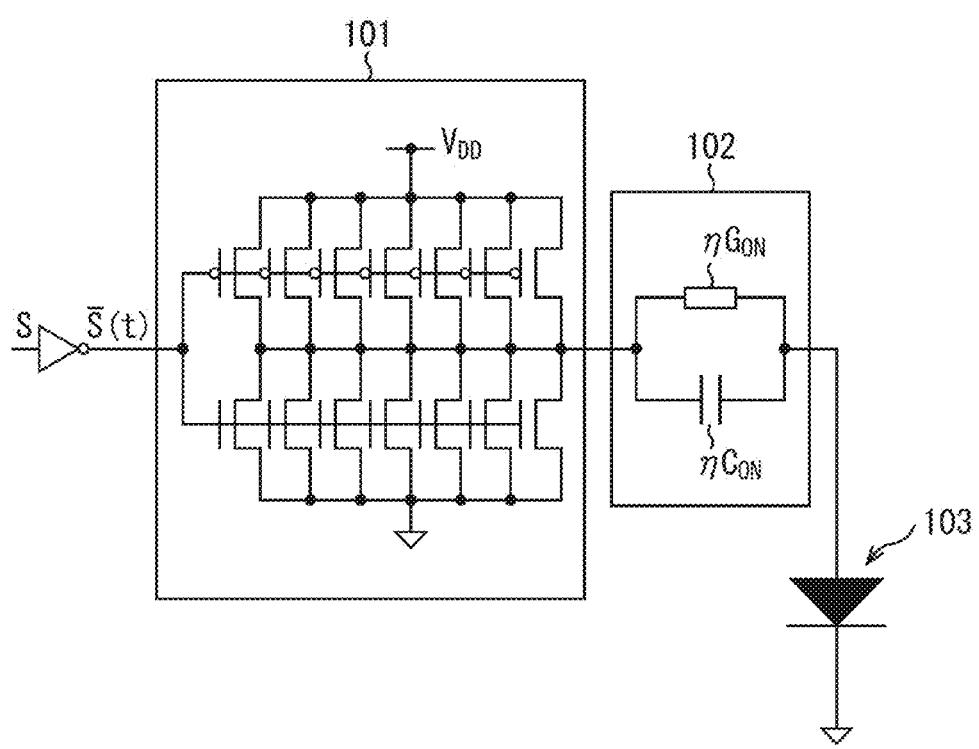
FIG. 8 is a circuit configuration diagram obtained by combining a matching circuit and a diode with a CMOS inverter circuit.
Figure 9A:
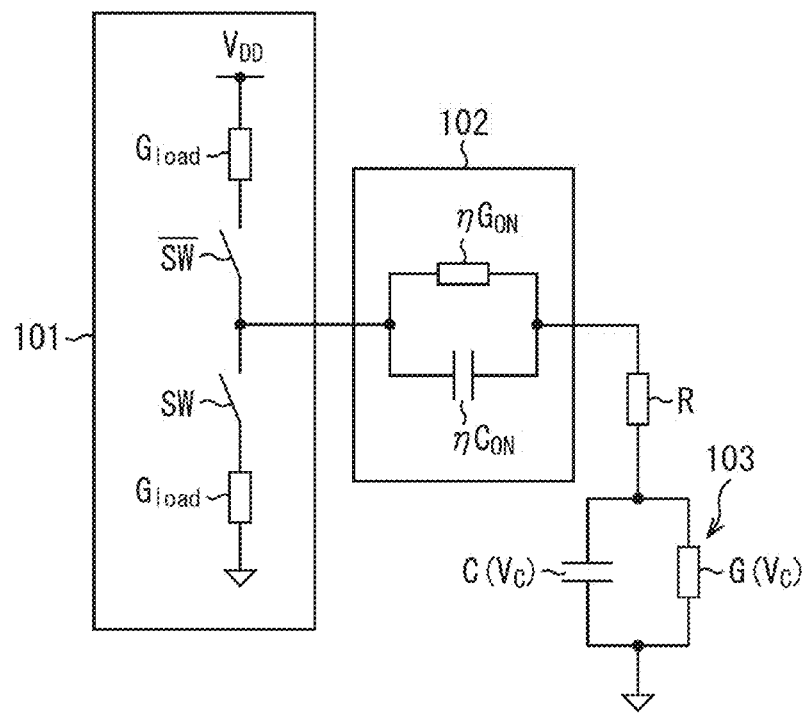
FIGS. 9A and 9B are views illustrating characteristics of a pre-emphasis circuit.
Figure 9B:
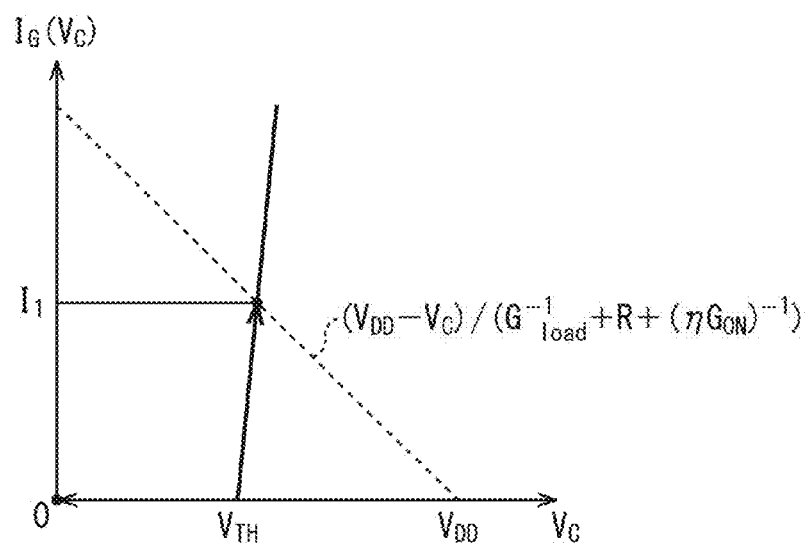
Figure 10A:
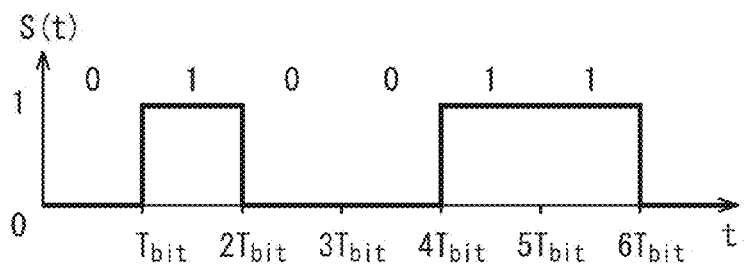
FIGS. 10A, 10B, and 10C are views illustrating timing charts in an equivalent circuit in FIG. 8.
Figure 10B:
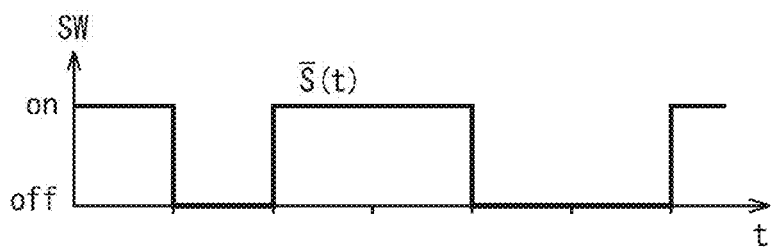
Figure 10C:
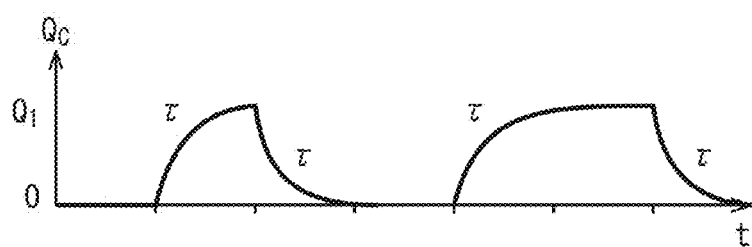
Figure 11:
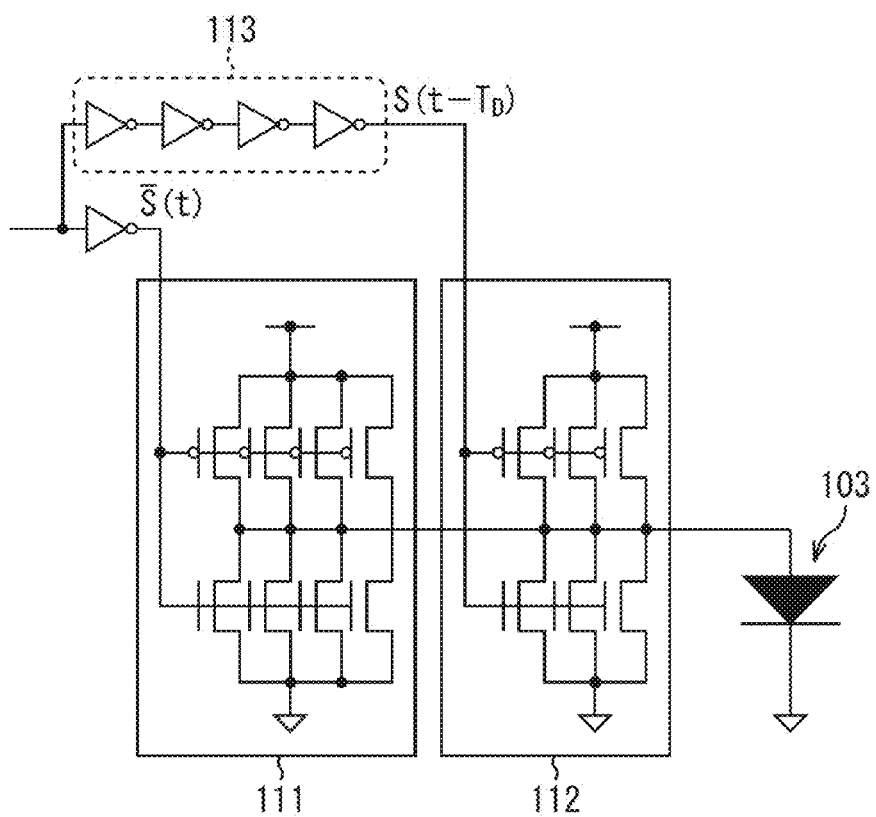
FIG. 11 is a circuit configuration diagram of a pre-emphasis circuit.
Figure 12A:
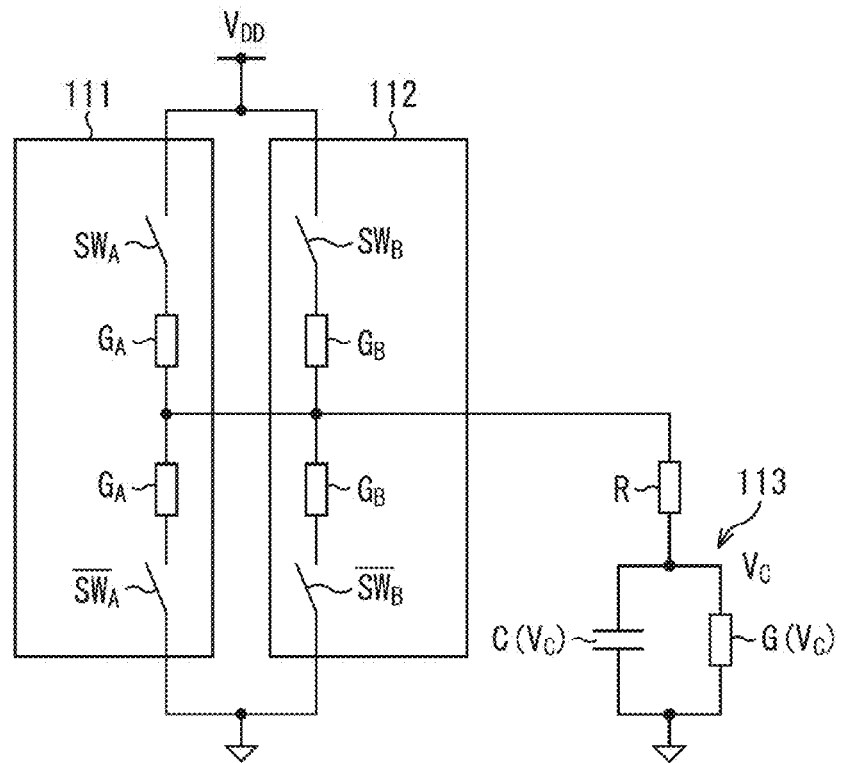
FIGS. 12A and 12B are views illustrating characteristics of the pre-emphasis circuit.
Figure 12B:
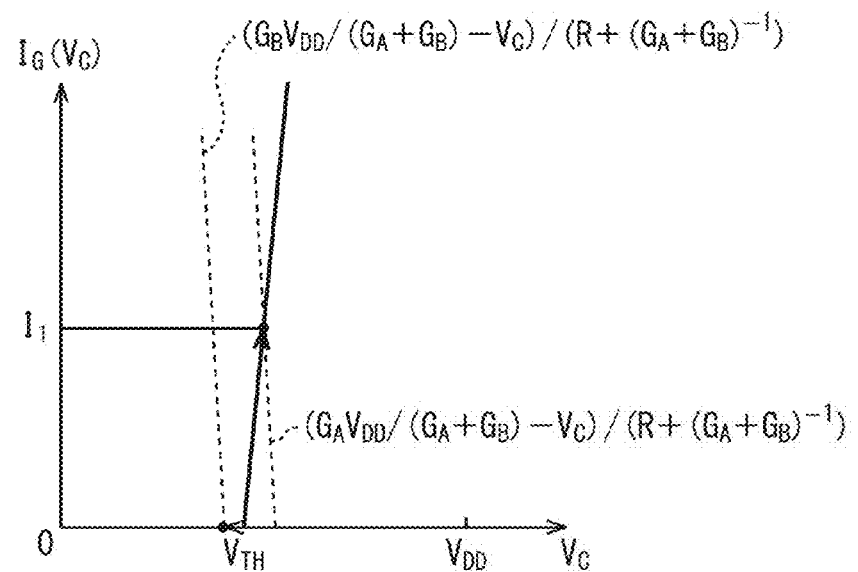
Figure 13A:
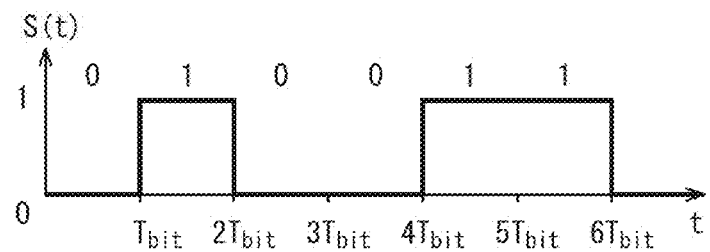
FIGS. 13A, 13B, 13C, and 13D are views illustrating timing charts in the pre-emphasis circuit.
Figure 13B:
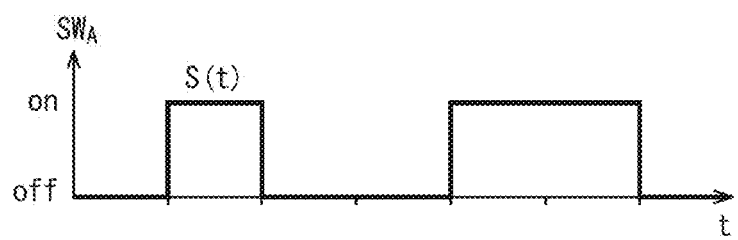
Figure 13C:
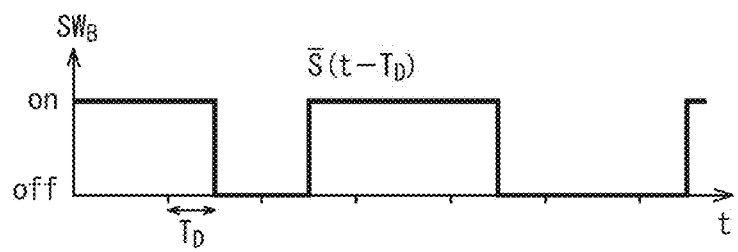
Figure 13D:
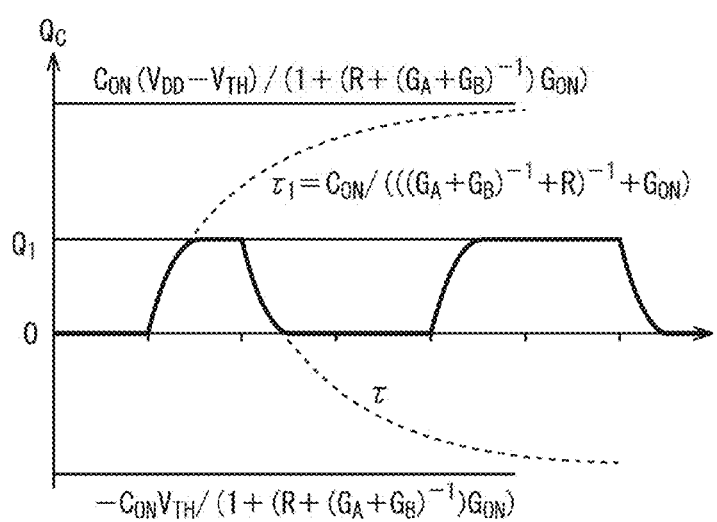

In the optical semiconductor device, an equivalent circuit 1 exhibiting characteristics of an electric-optic conversion element provided with a diode similar to that in FIG. 7B, and a driving circuit 2 connected to the equivalent circuit 1 are provided.

The driving circuit 2 includes a power supply voltage $V_{DD}$, a first switching circuit 11, a second switching circuit 12, and a third switching circuit 13. The first and third switching circuits 11 and 13 are connected in parallel with each other. The second switching circuit 12 is connected in series with the first and third switching circuits 11 and 13.

The first switching circuit 11 is provided with a first switch $SW_1$, and has internal conductance $G_1$. The second switching circuit 12 is provided with a second switch $SW_2$, and has internal conductance $G_2$. The third switching circuit 13 is provided with a third switch $SW_3$, and has internal conductance $G_3$.

The first switching circuit 11 constitutes a first signal line $S_1$ that charges the electric-optic conversion element of the equivalent circuit 1 with an electric charge independently of the second switching circuit 12 by bringing the first switch $SW_1$ into an ON state and the second switch $SW_2$ into an OFF state. A process in which an output of the electric-optic conversion element is changed from a '0' state to a '1' state corresponds to a process in which an electric charge is stored (a charging process). The first switch $SW_1$ is put in an OFF state except when the electric-optic conversion element is charged with an electric charge.

The second switching circuit 12 constitutes a second signal line $S_2$ that discharges the electric charge stored in the electric-optic conversion element of the equivalent circuit 1 independently of the first switching circuit 11 by bringing the second switch $SW_2$ into an ON state and the first switch $SW_1$ into an OFF state. A process in which the output of the electric-optic conversion element is changed from a '1' state to a '0' state corresponds to a process in which the electric charge is discharged (a discharging process). The second switch $SW_2$ is put in an OFF state when the electric-optic conversion element is charged with an electric charge.

The third switching circuit 13 is a circuit that maintains the output of the electric-optic conversion element in a '1' state when the output assumes the '1' state. The third switching circuit 13 constitutes the first signal line $S_1$ by bringing the third switch $SW_3$ into an ON state together with the first switch $SW_1$ when the electric-optic conversion element of the equivalent circuit 1 is charged with an electric charge. In the third switching circuit 13, the internal conductance $G_3$ has a relationship of $G_3 < G_1$.

In the present embodiment, internal conductance in the second signal line $S_2$ is larger than conductance in the first signal line $S_1$ in the above circuit configuration. That is, in the first, second, and third switching circuits 11, 12, and 13, the internal conductance $G_1$, the internal conductance $G_2$, and the internal conductance $G_3$ have a relationship of $G_2 > G_1 + G_3$.

Figure 1B:
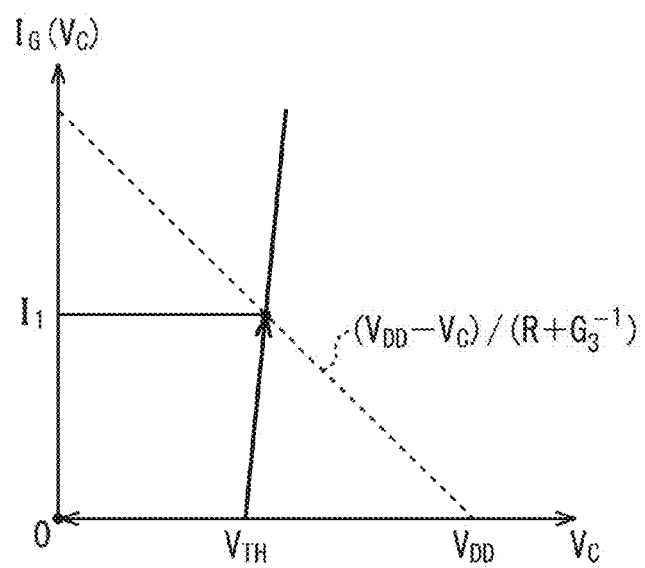

In the driving circuit 2, the internal conductance $G_3$ of the third switching circuit 13 is designed so as to maintain the output of the electric-optic conversion element in a '1' state when the output assumes the '1' state. As illustrated in FIG. 1B, with regard to a load line indicated by a dashed line, generally, $R^{-1}$, $G_{ON} \gg G_3$. Thus, inclination of the load line depends on the internal conductance $G_3$. Therefore, a relative error of $G_3$ and a relative error of $I_3$ substantially correspond to each other. As compared to a case in which a voltage $V_1$ is applied by resistance division, characteristic fluctuations can be suppressed with respect to manufacturing fluctuations of a semiconductor.

Figure 2A:
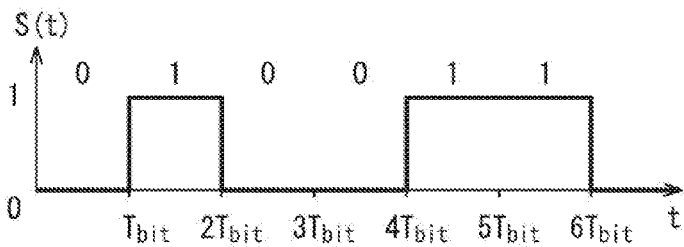
FIGS. 2A, 2B, 2C, and 2D are views illustrating timing charts in an equivalent circuit in FIG. 1A.
Figure 2B:
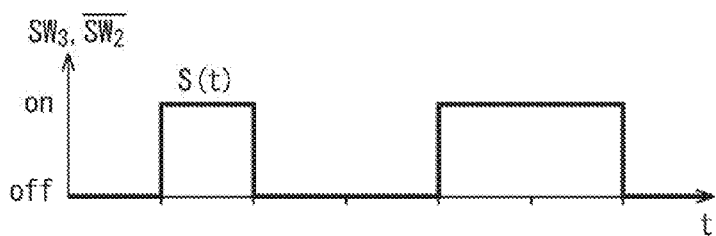
Figure 2C:
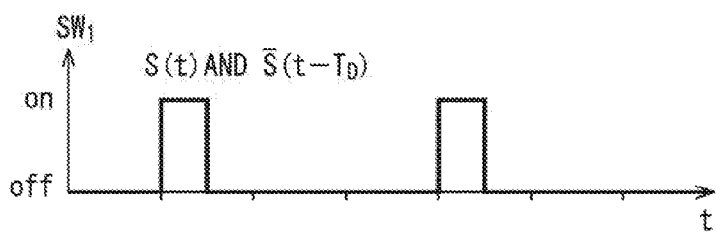

FIGS. 2A, 2B, 2C, and 2D illustrate timing charts in the equivalent circuit in FIG. 1A. FIG. 2A illustrates a binary signal sequence having a bit time $T_{bit}$. FIG. 2B illustrates a state of the switches $SW_1$ and $SW_3$ corresponding to the signal. FIG. 2C illustrates a state of the switch $SW_2$ corresponding to the signal. When the switch $SW_2$ is in an ON state, the switches $SW_1$ and $SW_3$ are in an OFF state, and a through current does not flow through the driving circuit 2. Therefore, power consumption becomes smaller than that of a pre-emphasis circuit.

Figure 2D:
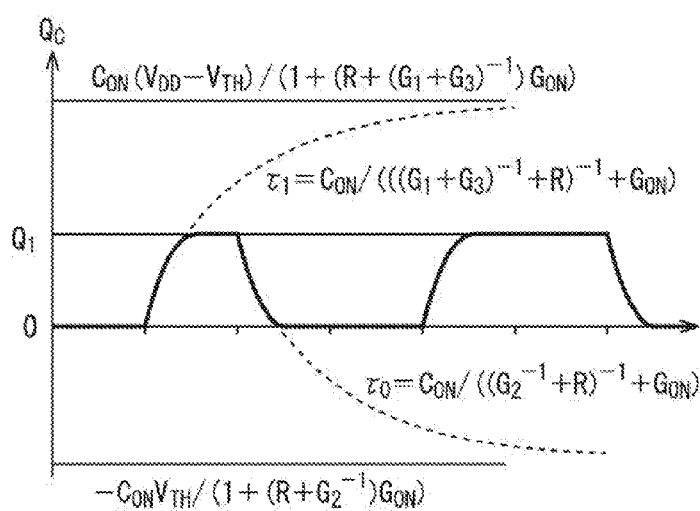

When the internal conductance during the discharging process becomes smaller than the internal conductance during the charging process, the stored electric charge remains even in a '0' state, and an output level varies by the signal sequence. Thus, the internal conductance $G_1$ and the internal conductance $G_2$ are designed so as not to obtain a relationship of $G_2 < G_1 + G_3$ in consideration of the manufacturing fluctuations. In this case, time constants $\tau_0$ and $\tau_1$ have a relationship of $\Sigma_1 > \tau_0$ as illustrated in FIG. 2D.

The diode has nonlinearity. Thus, as long as the condition of $G_2 > G_1 + G_3$ is satisfied, the stored electric charge does not remain in a '0' state in any signal sequence, and the output level does not vary.

In the following, some specific examples of the equivalent circuit illustrated in FIG. 1A are described.

Specific Example 1

Figure 3:
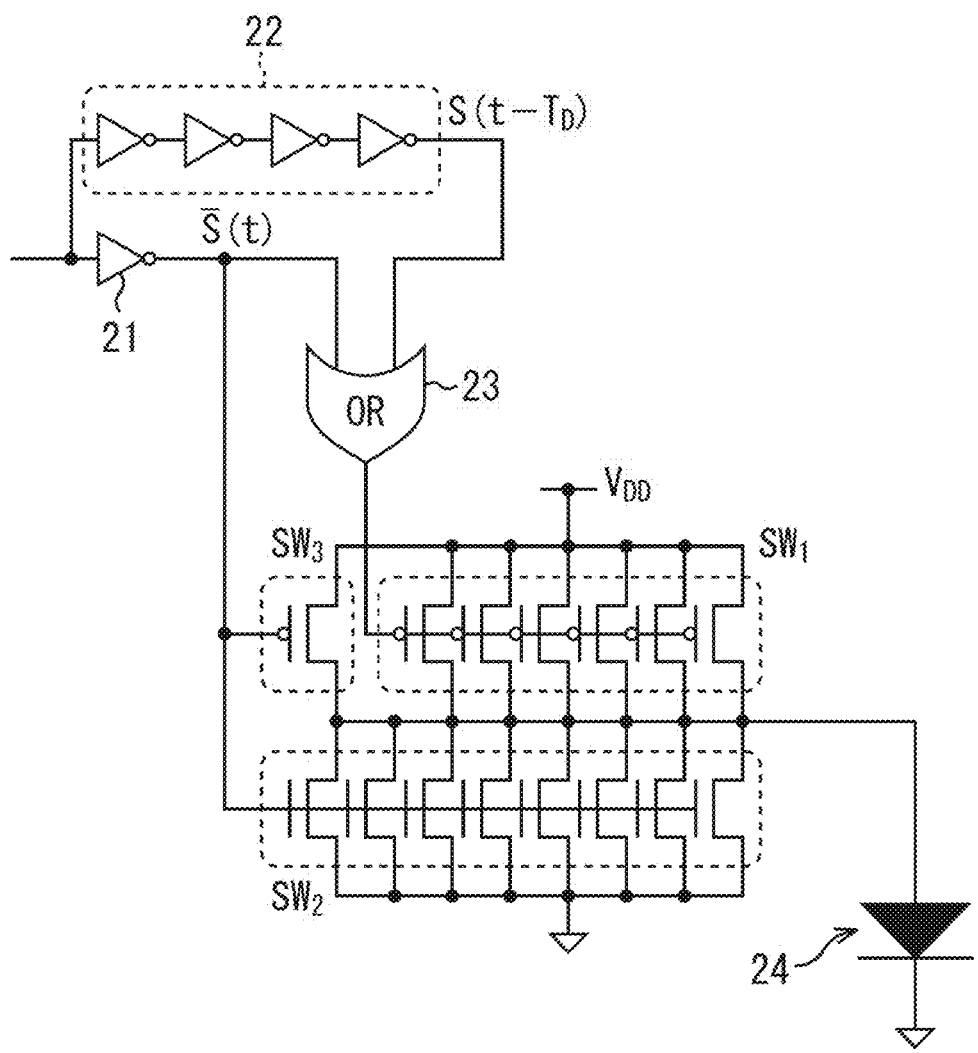
FIG. 3 is a circuit configuration diagram illustrating Specific Example 1 of the main configuration of the optical semiconductor device in the first embodiment.

FIG. 3 is a circuit configuration diagram illustrating Specific Example 1 of the main configuration of the optical semiconductor device in the first embodiment.

The circuit configuration includes an inverter 21, a delay circuit 22, an OR circuit 23, a power supply voltage $V_{DD}$, and first to third switches $SW_1$ to $SW_3$ as a final stage of a driving circuit. A diode 24 is connected to the driving circuit.

A binary signal S(t) having a bit time is input to the inverter 21, and the inverter 21 inverts the signal S(t). The delay circuit 22 has a plurality of inverters, and delays the signal S(t) by a delay time $T_D$. Two types of signals passing through the inverter 21 and the delay circuit 22 are input to the OR circuit 23.

The first switch $SW_1$ is composed of a plurality of pMOSFETs, and the third switch $SW_3$ is composed of a pMOSFET. The second switch $SW_2$ is composed of a plurality of nMOSFETs. An nMOSFET having the same gate width as a pMOSFET has higher current driving capacity than the pMOSFET. Thus, the nMOSFET is used for the second switch $SW_2$. The numbers of transistors of the first to third switches $SW_1$ to $SW_3$ are designed so as to satisfy the condition of $G_2 > G_1 + G_3$. An output terminal of the driving circuit is connected to an anode of the diode 24.

A common signal is input to the second and third switches $SW_2$ and $SW_3$. A signal passing through the OR circuit 23 is input to the first switch $SW_1$.

The configuration of the driving circuit is not limited to the above configuration as long as the timing charts in FIGS. 2B and 2C can be achieved. In the above configuration, the first and third switches $SW_1$ and $SW_3$ may be composed of the nMOSFETs, the second switch $SW_2$ may be composed of the pMOSFETs, and the output terminal of the driving circuit may be connected to a cathode of the diode 24.

Specific Example 2

Figure 4A:
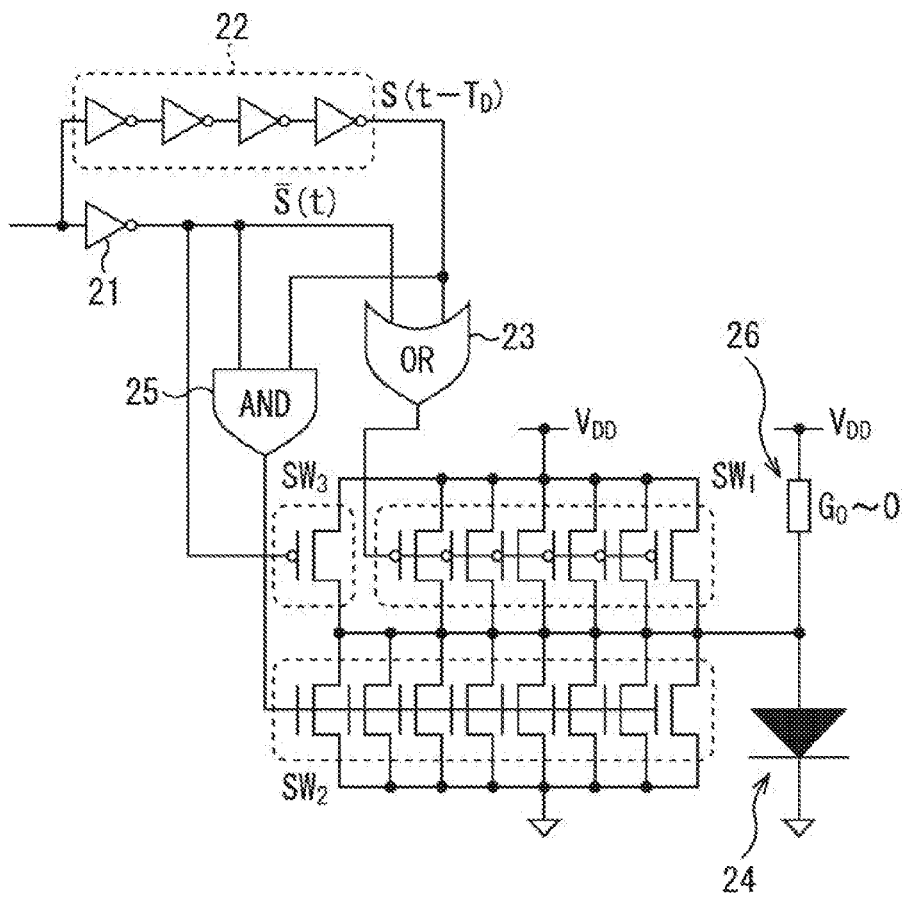
FIGS. 4A and 4B are views illustrating Specific Example 2 of the main configuration of the optical semiconductor device in the first embodiment.

FIG. 4A is a circuit configuration diagram illustrating Specific Example 2 of the main configuration of the optical semiconductor device in the first embodiment. The same constituent members as those of Specific Example 1 are assigned the same reference numerals as those in FIG. 3, and the detailed description is omitted.

The circuit configuration includes the inverter 21, the delay circuit 22, the OR circuit 23, an AND circuit 25, the power supply voltage $V_{DD}$, the first to third switches $SW_1$ to $SW_3$, and high resistance 26 as a final stage of a driving circuit. The diode 24 is connected to the driving circuit.

Two types of signals passing through the inverter 21 and the delay circuit 22 are input to the AND circuit 25 similarly to the OR circuit 23, and the AND circuit 25 outputs a signal to the second switch $SW_2$. The high resistance 26 has a power supply voltage $V_{DD}$ and conductance $G_0$. The power supply voltage $V_{DD}$ is connected to an anode of the diode 24 via the conductance $G_0$.

Figure 4B:
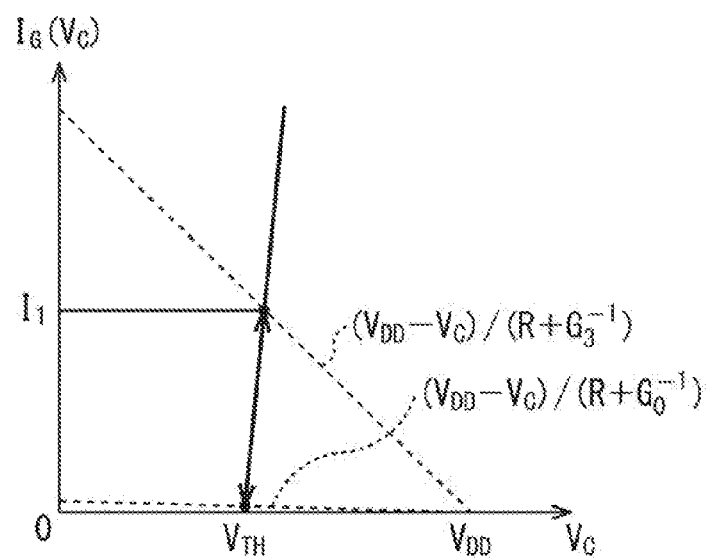

In a semiconductor laser, a little offset output is desired to be maintained even in a '0' state in some cases. In the present embodiment, by connecting the high resistance 26 to the diode 24, a voltage applied to capacitance C of the diode 24 is kept at a threshold voltage $V_{TH}$ in a '0' state as illustrated in FIG. 4B.

By connecting the AND circuit 25 as described above, the second switch $SW_2$ is surely brought into an 'OFF' state except when an electric charge stored in the capacitance C of the diode 24 is discharged. Because of the configuration, generation of a through current including an instantaneous through current in the driving circuit is suppressed.

The configuration of the driving circuit is not limited to the configuration using the AND circuit 25 as long as the aforementioned technical effect is produced. The aforementioned technical effect can be also produced even by a configuration without the high resistance 26 ($G_0=0$).

As described above, in accordance with the present embodiment, the optical semiconductor device including the highly-reliable driving circuit, which suppresses the generation of the through current in the driving circuit while achieving an excellent eye opening of a signal waveform by solving problems of the pre-emphasis circuit, such as a demand for excessive accuracy in an FET, can be achieved.

Second Embodiment

Next, a second embodiment is described. In the present embodiment, a Mach-Zehnder type optical modulator (MZ type modulator) having a circuit configuration including the driving circuit according to the first embodiment is disclosed as the optical semiconductor device.

Figure 5:
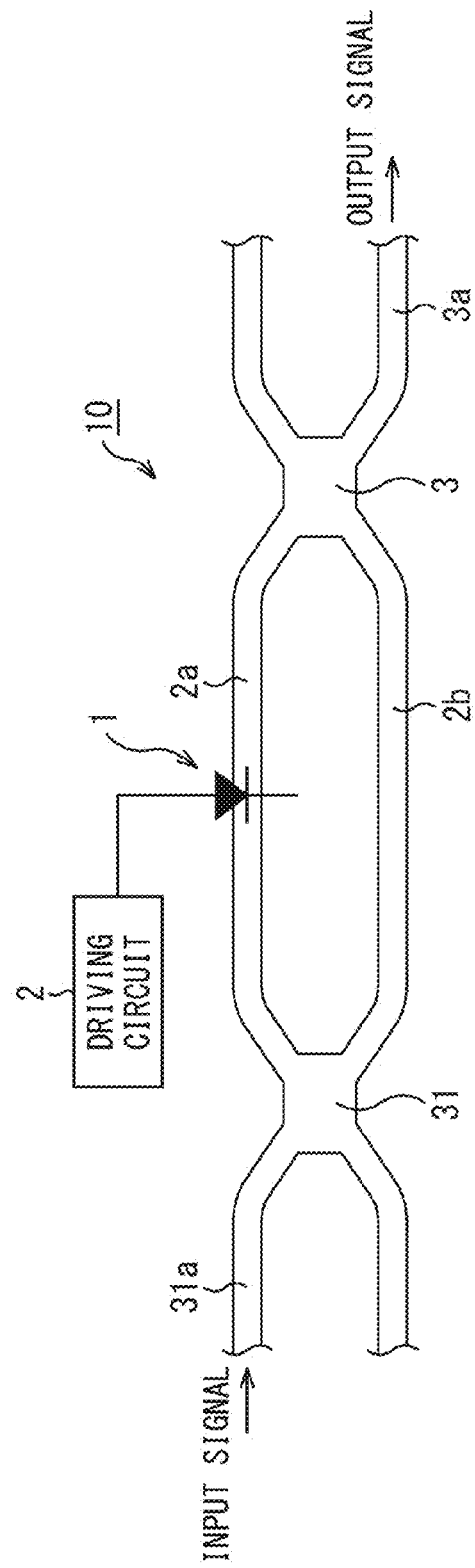
FIG. 5 is a plan view illustrating a schematic configuration of a MZ type modulator according to a second embodiment.

FIG. 5 is a plan view illustrating a schematic configuration of the MZ type modulator according to the present embodiment.

A MZ type modulator 10 includes an optical waveguide having a first optical coupler 31, arms 32a and 32b, and a second optical coupler 33, and the driving circuit 2 of FIG. 1A (FIG. 3, FIG. 4A) in the first embodiment that is connected to the arm 32a.

The first optical coupler 31 is an input coupler that is provided with an input port 31a, and splits incident light into two light beams. The arms 32a and 32b are waveguides through which the two split light beams are propagated. In the present embodiment, for example, a side surface grating waveguide 20 is integrally formed in a core portion of the arm 32a. The second optical coupler 33 is an output coupler that is provided with an output port 33a, and combines (couples) the light beams propagated through the arms 32a and 32b.

The side surface grating waveguide 20 is an electric-optic conversion element in which a first side surface grating 20a is integrally formed on one of side surfaces of the core portion of the arm 32a, and a second side surface grating 20b is integrally formed on the other of the side surfaces. The first side surface grating 20a is a p-type conductive (doped with p-type impurities) phase modulator that is formed in a comb-teeth shape. The second side surface grating 20b is an n-type conductive (doped with n-type impurities) phase modulator that is formed in a comb-teeth shape. The first side surface grating 20a, the core portion of the arm 32a, and the second side surface grating 20b constitute a pin diode. The diode corresponds to the diode of the equivalent circuit 1 of FIG. 1A (FIG. 3, FIG. 4A) in the first embodiment. The driving circuit applies a bias voltage to the first and second side surface gratings 20a and 20b. Accordingly, electrons and holes are injected respectively from the first side surface grating 20a and the second side surface grating 20b into the core portion of the arm 32a. A refractive index of the core portion is thereby changed, so that the light is phase-modulated. A side surface grating waveguide may be also provided in the arm 32b similarly to the arm 32a.

In accordance with the present embodiment, the MZ type modulator including the highly-reliable driving circuit, which suppresses the generation of the through current in the driving circuit while achieving an excellent eye opening of a signal waveform by solving problems of the pre-emphasis circuit, such as a demand for excessive accuracy in an FET, can be achieved.

In accordance with the aforementioned aspects, the optical semiconductor device including the highly-reliable driving circuit, which suppresses the generation of the through current in the driving circuit while achieving an excellent eye opening of a signal waveform by solving problems of the pre-emphasis circuit, such as a demand for excessive accuracy in an FET, can be achieved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optical semiconductor device comprising:
    an electric-optic conversion element that is provided with a diode; and
    a driving circuit that drives the diode in a forward direction, the driving circuit comprising
    a first switching circuit that is provided with a first switch,
    a second switching circuit that is provided with a second switch, and
    a third switching circuit that is provided with a third switch,
    wherein the first switching circuit constitutes a first signal line that charges the electric-optic conversion element with an electric charge independently of the second switching circuit by bringing the first switch into an ON state and the second switch into an OFF state,
    the second switching circuit constitutes a second signal line that discharges the electric charge stored in the electric-optic conversion element independently of the first switching circuit by bringing the second switch into an ON state and the first switch into an OFF state,
    the third switching circuit constitutes the first signal line by bringing the third switch into an ON state together with the first switch when the electric-optic conversion element is charged with an electric charge, and the third switching circuit has smaller conductance than conductance of the first switching circuit, and
    conductance of the second switching circuit is larger than a sum of the conductance of the first switching circuit and the conductance of the third switching circuit.

2. A method for controlling a driving circuit that drives a diode of an electric-optic conversion element in a forward direction, the driving circuit comprising
    a first switching circuit that is provided with a first switch,
    a second switching circuit that is provided with a second switch, and
    a third switching circuit that is provided with a third switch,
    wherein the third switching circuit constitutes a signal line by bringing the third switch into an ON state together with the first switch when the electric-optic conversion element is charged with an electric charge, and the third switching circuit has smaller conductance than conductance of the first switching circuit, and conductance of the second switching circuit is lamer than a sum of the conductance of the first switching circuit and the conductance of the third switching circuit, the method comprising:

charging the electric-optic conversion element with an electric charge independently of the second switching circuit by bringing the first switch into an ON state and the second switch into an OFF state; and discharging the electric charge stored in the electric-optic conversion element independently of the first switching circuit by bringing the second switch into an ON state and the first switch into an OFF state.

3. The optical semiconductor device according to claim 1, further comprising a resistance connected to the electric-optic conversion element.

4. The method for controlling a driving circuit according to claim 2, further comprising a resistance connected to the electric-optic conversion element.

\* \* \* \* \*